(12) United States Patent
Ikram et al.

(10) Patent No.: US 11,947,200 B2
(45) Date of Patent: Apr. 2, 2024

(54) ON-CHIP HEATER POWER CONTROL

(71) Applicant: MACOM Technology Solutions Holdings, Inc., Lowell, MA (US)

(72) Inventors: Quazi Ikram, Aliso Viejo, CA (US); Ronald Scott Karfelt, Horseheads, NY (US); Steven Nguyen, Garden Grove, CA (US); Nicholas Karfelt, Horseheads, NY (US); Saman Jafarlou, Irvine, CA (US); Swetha Babu, San Jose, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 17/039,023

(22) Filed: Sep. 30, 2020

(65) Prior Publication Data

US 2021/0096401 A1    Apr. 1, 2021

Related U.S. Application Data

(60) Provisional application No. 62/908,748, filed on Oct. 1, 2019.

(51) Int. Cl.
| | | |
|---|---|---|
| G02F 1/01 | (2006.01) | |
| G02F 1/225 | (2006.01) | |
| H05B 1/02 | (2006.01) | |
| H05B 3/06 | (2006.01) | |
| H03M 1/12 | (2006.01) | |

(52) U.S. Cl.
CPC .......... *G02F 1/0121* (2013.01); *G02F 1/0147* (2013.01); *G02F 1/225* (2013.01); *H05B 1/023* (2013.01); *H05B 3/06* (2013.01); *G02F 2203/50* (2013.01); *H03M 1/1205* (2013.01)

(58) Field of Classification Search
CPC .... G02F 1/0121; G02F 1/225; G02F 2203/50; H05B 1/023; H03M 1/1205
See application file for complete search history.

(56) References Cited

U.S. PATENT DOCUMENTS

| | | |
|---|---|---|
| 4,932,738 A | 6/1990 | Haas et al. |
| 10,162,117 B2 | 12/2018 | Morton et al. |
| 2005/0018720 A1 | 1/2005 | Kish, Jr. et al. |
| 2006/0062519 A1 | 3/2006 | Kish, Jr. |
| 2008/0063407 A1 | 3/2008 | Singh et al. |
| 2009/0100906 A1 | 4/2009 | Bonne |
| 2010/0247029 A1* | 9/2010 | Li .................. G02B 6/12007 385/14 |
| 2013/0148920 A1 | 6/2013 | Kissa |
| 2016/0161676 A1 | 6/2016 | Morton |

(Continued)

FOREIGN PATENT DOCUMENTS

WO    2007005755    1/2007

OTHER PUBLICATIONS

International Search Report and Written Opinion issued by the International Searching Authority, dated Feb. 17, 2021, for International Patent Application No. PCT/US2020/53528; 17 pages.

*Primary Examiner* — Sung H Pak
(74) *Attorney, Agent, or Firm* — Faegre Drinker Biddle & Reath LLP

(57) ABSTRACT

The present disclosure relates to optical phase modulation devices. The optical phase modulation devices may include a heater resistance which induces a phase change and control systems and methods of controlling the induced phase change.

35 Claims, 6 Drawing Sheets

(56) References Cited

U.S. PATENT DOCUMENTS

| | | |
|---|---|---|
| 2018/0039154 A1 | 2/2018 | Hashemi et al. |
| 2018/0217332 A9 | 8/2018 | Morton |
| 2018/0262268 A1 | 9/2018 | Nagarajan |
| 2018/0267340 A1 | 9/2018 | Rohde |
| 2019/0072833 A1 | 3/2019 | Nejadriahi et al. |
| 2019/0229494 A1 | 7/2019 | Idjadi et al. |

\* cited by examiner

US 11,947,200 B2

ON-CHIP HEATER POWER CONTROL

RELATED APPLICATIONS

This application claims the benefit of U.S. Provisional Application No. 62/908,748, filed Oct. 1, 2019, titled ON-CHIP HEATER POWER CONTROL, the complete disclosure of which is expressly incorporated by reference herein.

FIELD

The present disclosure relates to optical phase modulation devices and in particular optical phase modulation devices including a heater resistance which induces a phase change and control systems and methods thereof.

BACKGROUND

In Silicon Photonics (SiPh), optical devices can be integrated with electronic components using semiconducting materials and semiconductor manufacturing techniques. Among other uses, SiPh devices can be relied upon to communicate data between optical transmitters and receivers. Heater circuits are often used in SiPh devices for optical phase modulation. In a traditional approach, a heater resistance of the heater circuit can be supplied a current. The current can pass through the heater resistance to generate heat. The heat can be used, in part, to modulate light, such as that produced by a light or laser emitting diode, and the modulated light can be transmitted to an optical receiver over optical waveguides, fiber optic cables, etc. The heat generated by heater circuits in SiPh and related devices can also be used for other purposes.

SUMMARY

In an exemplary embodiment of the present disclosure, an on-chip heater of an optical phase modulation device to induce a desired optical phase change in the optical phase modulation device is provided. The on-chip heater comprising: a heater circuit including a heater resistance which induces an optical phase change in the optical phase modulation device; and a heater power controller operatively coupled to the heater circuit to monitor an electrical characteristic of the heater circuit and to control an input current to the heater circuit. The input current of the heater circuit being set based on the monitored electrical characteristic and a target value corresponding to the desired optical phase change.

In an example thereof, the monitored electrical characteristic is a monitored voltage of the heater circuit. In a variation thereof, the monitored voltage of the heater circuit is a voltage drop across the heater resistance.

In another example thereof, the monitored electrical characteristic and the target value corresponding to the desired optical phase change are evaluated to determine if the input current to the heater circuit should be altered to cause the induced optical phase change to equal the desired optical phase change. In a variation thereof, the monitored characteristic is a monitored voltage drop across the heater resistance and the monitored voltage, the target value, and the input current of the heater circuit are evaluated to determine if the input current to the heater circuit should be altered to cause the induced optical phase change to equal the desired optical phase change. In a further variation thereof, the monitored voltage is multiplied by the input current to provide a monitored power of the heater resistance, the target value is a target power value, and the monitored power is compared to the target power value. In another variation thereof, if the monitored power of the heater resistance exceeds the target power value by a first amount, the input current to the heater circuit is reduced and if the target power value exceeds the monitored power of the heater resistance by a second amount the input current to the heater circuit is increased.

In a further example thereof, the input current of the heater circuit is a digital current code and the heater circuit includes a heater digital-to-analog converter (DAC) configured to provide a current to flow through the heater resistance based on the digital current code. In a variation thereof, the monitored electrical characteristic of the heater circuit is a monitored voltage drop across the heater resistance and the heater power controller includes: an analog-to-digital converter (ADC) configured to convert the monitored voltage drop across the heater resistance to a digital voltage code; a digital multiplier configured to multiply the digital voltage code with the digital current code to generate a heater power code; and a bidirectional counter configured to update the digital current code to regulate power dissipated by the heater resistance based on a comparison of a reference power code and the heater power code.

In another exemplary embodiment of the present disclosure, an optical phase modulation device is provided. The optical phase modulation device comprising: an input waveguide; a reference arm waveguide optically coupled with the input waveguide; a phase modulated arm waveguide optically coupled with the input waveguide; an output waveguide optically coupled to the reference arm waveguide and the phase modulated arm waveguide; and a heater. The heater including: a heater resistance positioned to modulate light traversing the phase modulated arm waveguide, a heater circuit operatively coupled to the heater resistance to provide a current to the heater resistance, and a heater power controller which based on a monitored electrical characteristic of the heater resistance controls the current provided by the heater circuit to the heater resistance.

In a further exemplary embodiment of the present disclosure, a method of controlling an optical modulation device to induce a desired optical phase change of the optical modulation device is provided. The method comprising the steps of: providing a first current command to a heater circuit to alter a temperature of a heater resistance of an optical modulation device; monitoring an electrical characteristic of the heater resistance; determining that the monitored electrical characteristic indicates that a first optical phase change different from the desired optical phase change is being induced in the optical modulation device; and in response to the determination that the first optical phase change is being induced, providing a second current command to the heater circuit, the second current command being different than the first current command.

In an example thereof, the second current command alters the optical phase change of the optical modulation device towards the desired optical phase change.

In another example thereof, the step of determining that the monitored electrical characteristic indicates that the first optical phase change being induced in the optical modulation device is different from the desired optical phase change includes the steps of: determining a first value based on the monitored electrical characteristic; comparing the first value to a target value, the target value being representative of the desired optical phase change; and when a difference between the first value and the target value has a first characteristic, determine that the first optical phase change is being induced. In a variation thereof, the first characteristic is that a magnitude of the difference exceeds a threshold. In another variation thereof, the monitored electrical characteristic is a voltage drop across the heater resistance, the first value is a heater power value, and the target value is a reference power value.

In a still further example thereof, the first current command is a digital current code.

In a further exemplary embodiment of the present disclosure, an on-chip power-controlled heater is provided. The on-chip power-controlled heater comprising: a heater resistance; a heater digital-to-analog converter (DAC) configured to provide a current to flow through the heater resistance based on a digital current code provided to the heater DAC; an analog-to-digital converter (ADC) configured to monitor a voltage across the heater resistance and convert the voltage to a digital voltage code; a digital multiplier configured to multiply the digital voltage code with the digital current code to generate a heater power code; and a bidirectional counter configured to update the digital current code to regulate power dissipated by the heater resistance based on comparison of a reference power code and the heater power code.

In an example thereof, the bidirectional counter increases a bit value of the digital current code and stores an updated digital current code in a register of the heater DAC based on the heater power code being less than the reference power code.

In another example thereof, the bidirectional counter decreases a bit value of the digital current code and stores an updated digital current code in a register of the heater DAC based on the heater power code being less than the reference power code.

In a further example thereof, the bidirectional counter retains a bit value of the digital current code in a register of the heater DAC based on the heater power code being equal to the reference power code or within a threshold percentage of the reference power code.

In yet another example thereof, the the heater resistance comprises a plurality of heater resistances; and the heater DAC comprises a respective heater DAC for each of the plurality of heater resistances. In a variation thereof, the ADC comprises a multi-channel successive-approximation-register (SAR) ADC that utilizes time division multiplexing to regulate power for the plurality of heater resistances. In another variation thereof, the bidirectional counter is configured to update a digital current code for individual ones of the plurality of heater resistances.

In a still further exemplary embodiment of the present disclosure, a heater power controller is provided. The heater power controller comprising: an analog-to-digital converter (ADC) configured to monitor a voltage across a heater and convert the voltage to a digital voltage code; a digital multiplier configured to multiply the digital voltage code with a digital current code to generate a heater power code; and a bidirectional counter configured to regulate the digital current code based on comparison of the heater power code to a reference power code and provide the digital current code to a heater digital-to-analog converter (DAC) to regulate power dissipated by the heater.

In an example thereof, the ADC utilizes time division multiplexing to regulate power dissipated by a plurality of heaters. In a variation thereof, the bidirectional counter is further configured to update a plurality of registers corresponding to the plurality of heaters based on the time division multiplexing.

In another example thereof, the heater power controller further comprises a comparator circuit that compares the heater power code to the reference power code.

In yet another example thereof, the heater power controller is an on-chip heater power controller for an optical phase modulation circuit.

In still a further example thereof, the reference power code comprises a predetermined number of bits, and the reference power code is compared to a subset of a total number of bits of the heater power code generated by the digital multiplier.

In a further still example thereof, the reference power code is determined by an open-loop mode of the heater power controller using a mode selection multiplexer.

In a further still exemplary embodiment of the present disclosure, a method for on-chip heater power control is provided. The method comprising: converting a voltage across a heater to a digital voltage code; multiplying the digital voltage code with a digital current code to generate a heater power code; comparing the heater power code to a reference power code to regulate the digital current code; and inputting the digital current code to a heater digital-to-analog converter (DAC) to control a current to flow through the heater.

In an example thereof, the method further comprises selecting open-loop operation for the on-chip heater power control using a mode selection multiplexer; providing the heater DAC with an open-loop current code through the mode selection multiplexer; determining an open-loop heater power code while the open-loop operation is selected, wherein the reference power code is a predetermined number of bits of the open-loop heater power code; and selecting closed-loop operation for the on-chip heater power control using the mode selection multiplexer, wherein the digital current code is a closed-loop digital current code.

In another example thereof, the reference power code comprises a predetermined number of bits, and the reference power code is compared to a subset of a total number of bits of the heater power code.

In still another example thereof, the method further comprises increasing a bit value of the digital current code based on comparing the heater power code to the reference power code.

In yet still another example thereof, the method further comprises decreasing a bit value of the digital current code based on comparing the heater power code to the reference power code.

In still a further example thereof, the method further comprises retaining a bit value of the digital current code in a register of the heater DAC based on the heater power code being within a predetermined threshold of the reference power code.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments. In the drawings, like reference numerals designate like or corresponding, but not necessarily the same, elements throughout the several views.

DETAILED DESCRIPTION OF THE DRAWINGS

As noted above, resistive heaters can be used in on-chip systems including Silicon Photonics (SiPh) optical phase modulation devices and systems, among others. However, the characteristics of a heater resistance and the heat generated by the heater resistance can vary substantially based on on-chip operating conditions. For example, a poly-silicon resistive heater with a typical resistance of 30 ohms can vary in resistance from about 20-45 ohms over operating temperatures. Thus, even if the current supplied to such a heater resistance is fixed, the amount of heat generated by the heater resistance will vary over the operating range of the heater resistance. This results in inadequate performance for on-chip systems, such as optical phase modulation devices and systems, among others. Exemplary optical phase modulation devices include optical modular and optical multiplexers. Exemplary optical modulators and optical multiplexers may include a Mach-Zehnder interferometer.

The power consumed and heat generated by a heater resistance can be controlled by adjusting the amount of current that passes through the heater resistance. If the current is fixed, the power and heat will not necessarily stay constant over operating conditions, as the operating characteristics of the heater resistance can change as described above. In order to compensate for this variation in power and heat, an on-chip closed loop power control system and method is described herein. The power control loop is designed to maintain the power consumed and heat generated by a heater at a constant or near-constant level based on a reference value.

Thus, various aspects of heater power control for on-chip systems are described herein. In one example, a heater power controller includes an analog-to-digital converter (ADC) that monitors a heater voltage across a heater resistance and converts the heater voltage to a digital voltage code. A digital multiplier multiplies the digital voltage code with a digital current code to generate a heater power code corresponding to a heater power. A bidirectional counter regulates the digital current code based on comparison of the heater power code to a reference power code. The digital current code is provided to a heater digital-to-analog converter (DAC) to regulate the heater power.

Figure 1:
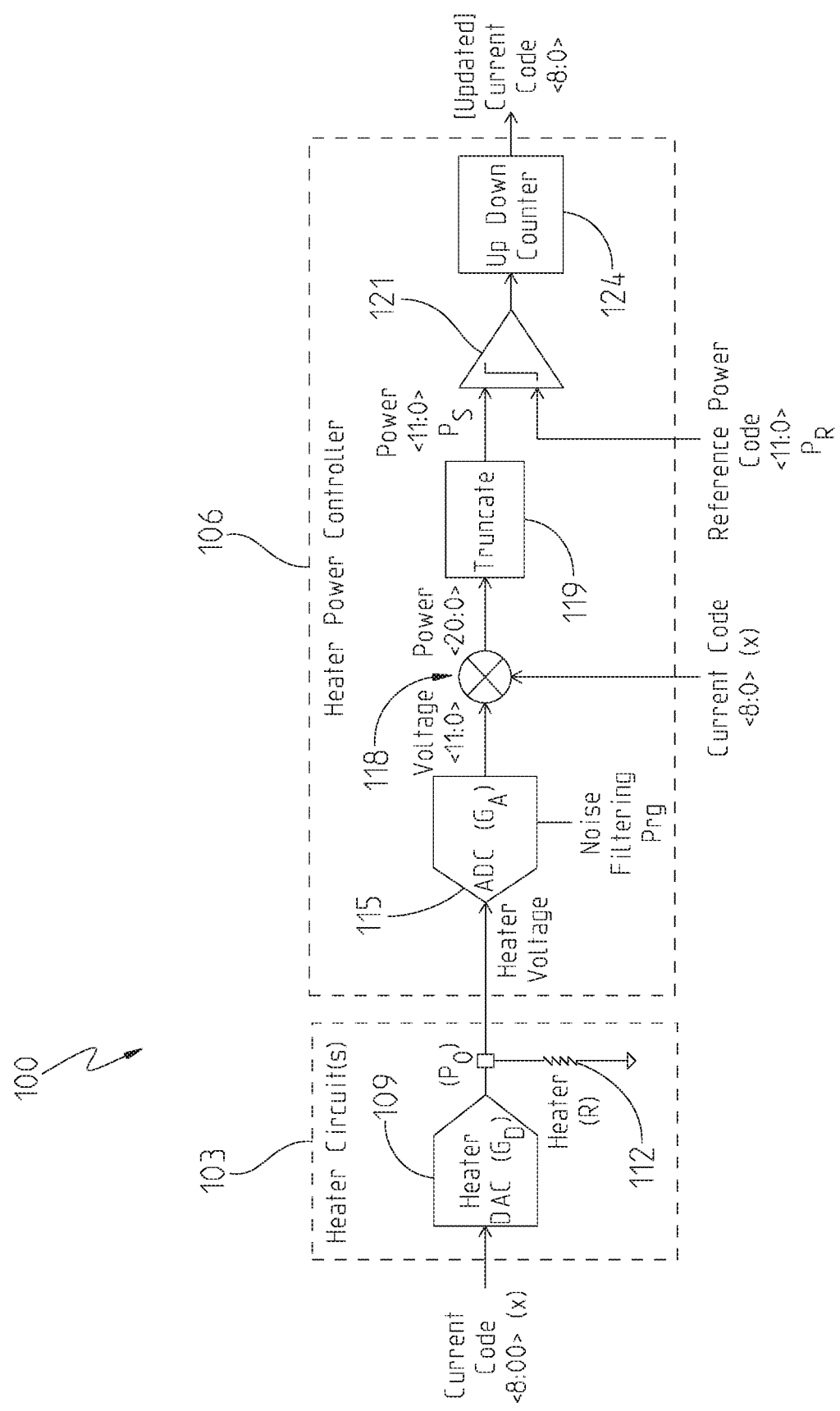
FIG. 1 illustrates an example power controlled heater circuit according to various embodiments described herein.

Turning to the drawings, FIG. 1 illustrates an example power-controlled heater circuit 100. The power-controlled heater circuit 100 is provided as a representative implementation of the concepts described herein, but the concepts can also be reduced to practice with variations of the power-controlled heater circuit 100 and other circuits. The power-controlled heater circuit 100 can include one or more heaters 103 and a heater power controller 106, among other components, as shown.

The heater circuit 103 can include a heater DAC 109 and a heater resistance 112 (R), among other components. The power ($P_O$) consumed or dissipated by the heater resistance 112 can be calculated as $I^2R$ or $V^2/R$, where I is the heater current across the heater resistance 112 and V is the heater voltage across the heater resistance 112. The heater resistance 112 can be provided by a resistor or other source of resistance. The heater DAC 109 can have a heater DAC gain ($G_D$).

The heater power controller 106 can include an analog-to-digital converter (ADC) circuit 115 with ADC gain ($G_A$), a digital multiplier circuit 118, a truncate circuit 119, a comparator circuit 121, and a bidirectional or up/down counter circuit 124, among other components. The heater power controller 106 is configured to maintain a constant level of power dissipation for the heater circuit 103 based on a target or reference power code. The target or reference power code (e.g., the 12 bit reference power code <11:0> $P_R$ in FIG. 1) can be provided from an on-chip controller, an off-chip controller, or any other suitable source. The heater power controller 106 can seek to maintain the power of the heater circuit 103 by updating a current code provided to the heater circuit 103. In the embodiment shown in FIGS. 2A and 2B and described below, the heater power controller 106 can monitor and maintain the power of a number of heater circuits 103, for example, by time division multiplexing. In other cases, the heater power for a single heater circuit 103 can be monitored and maintained by the heater power controller 106.

To maintain a constant (or near constant) heater power for the heater resistance 112 of the heater circuit 103, the heater DAC 109 generates a sourcing current based on a 9 bit digital current code (e.g., <8:0>), and the current is provided to flow through the heater resistance 112. The ADC 115 of the heater power controller 106 is configured to monitor an analog voltage across the heater resistance 112 to generate a 12 bit digital voltage code (e.g., <11:0>). The ADC 115 can be a multi-channel successive-approximation-register (SAR) ADC, such as a 12 bit SAR ADC, although other types of ADCs 115 can also be used. The ADC 115 can convert the analog voltage across the heater resistance 112 into a digital voltage code comprising a number of bits representative of the analog voltage.

The digital multiplier 118 is configured to multiply the digital current code provided to the heater DAC 109 with the digital voltage code generated by the ADC 115 to calculate a measured heater power code (e.g., <20:0>) for the heater circuit 103. Where the digital current code is a 9 bit digital current code <8:0> and the digital voltage code is a 12 bit digital voltage code <11:0>, the digital multiplier 118 can output a 21 bit measured heater power code <20:0>, although any suitable number of bits can be used depending upon the desired accuracy of the power-controlled heater circuit 100 and other factors.

In some cases, the measured heater power code output from the digital multiplier 118 can be too large or include too many bits. In other words, the measured heater power code output can include one or more bits of unnecessary or undesirable precision. In such cases, the truncate circuit 119 is configured to truncate one or more bits of the measured heater power code to a smaller or truncated heater power code that includes fewer bits (e.g., a 12 bit code <11:0>). In this case, the number of bits of the truncated heater power code can match a number of bits of the target or reference power code (e.g., the 12 bit reference power code <11:0> $P_R$ shown in FIG. 1). In turn, the comparator circuit 121 can compare the truncated heater power code and the reference power code. In some examples, the truncate circuit 119 can be omitted from the heater power controller 106, and the comparator circuit 121 can compare the first (or last) "n" bits of the measured heater power code to the reference power code, where the reference power code includes "n" bits.

In the example shown in FIG. 1, the comparator circuit 121 is configured to compare the truncated heater power code from the truncate circuit 110 and the target $P_R$ reference power code. As noted above, the target or reference power code (e.g., the 12 bit reference power code <11:0> $P_R$ shown in FIG. 1) can be provided from another controller. Based on the relative values of the truncated heater power code and the reference power code, the comparator circuit 121 is also configured to provide an output signal representative of which code is larger to the bidirectional counter 124.

In one example, if the truncated heater power code is greater than the reference power code (or greater by a predetermined amount or threshold, e.g., to prevent dithering), then the comparator circuit 121 can output a negative pulse, down pulse, or other down indicator to the bidirectional counter 124. Alternatively, if the reference power code is greater than the truncated heater power code (or greater by a predetermined amount or threshold, e.g., to prevent dithering), then the comparator circuit 121 can output a positive pulse, up pulse, or other up indicator to the bidirectional counter 124.

The bidirectional counter 124 can include a register to store the digital current code for the heater circuit 103. The digital current code stored in the register of the bidirectional counter 124 is also provided to the heater DAC 109 of the heater circuit 103, closing the loop of control between the heater power controller 106 and the heater circuit 103. If the heater power controller 106 is designed to control more than one heater circuit 103, the bidirectional counter 124 can include multiple registers, and each register can be associated with a respective heater circuit 103 or a group of heater circuits 103.

The bidirectional counter 124 can increment a bit value of the digital current code for the heater circuit 103 based on the output of the comparator circuit 121. In effect, a bit value of the current code can be down-counted or decreased based on a down indicator from the comparator circuit 121, when the power of the heater resistance 112 is greater than that expected based on the reference power code. On the other hand, the bit value of the current code can be up-counted or increased based on an up indicator from the comparator circuit 121, when the power of the heater resistance 112 is less than that expected based on the reference power code. The current code can be incremented or decremented by any suitable bit value.

Figure 2A:
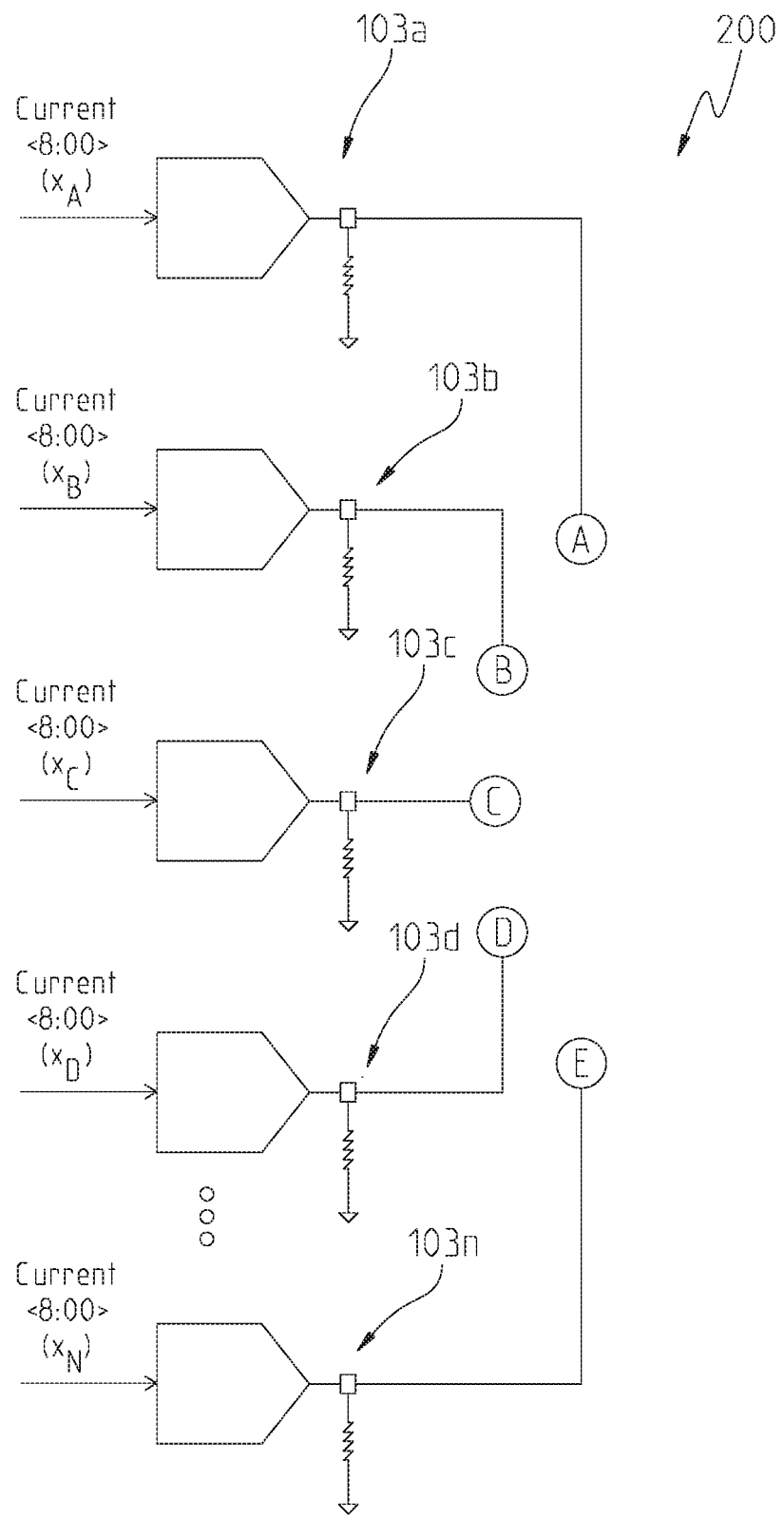
FIGS. 2A and 2B illustrates another example power controlled heater circuit according to various embodiments described herein.
Figure 2B:
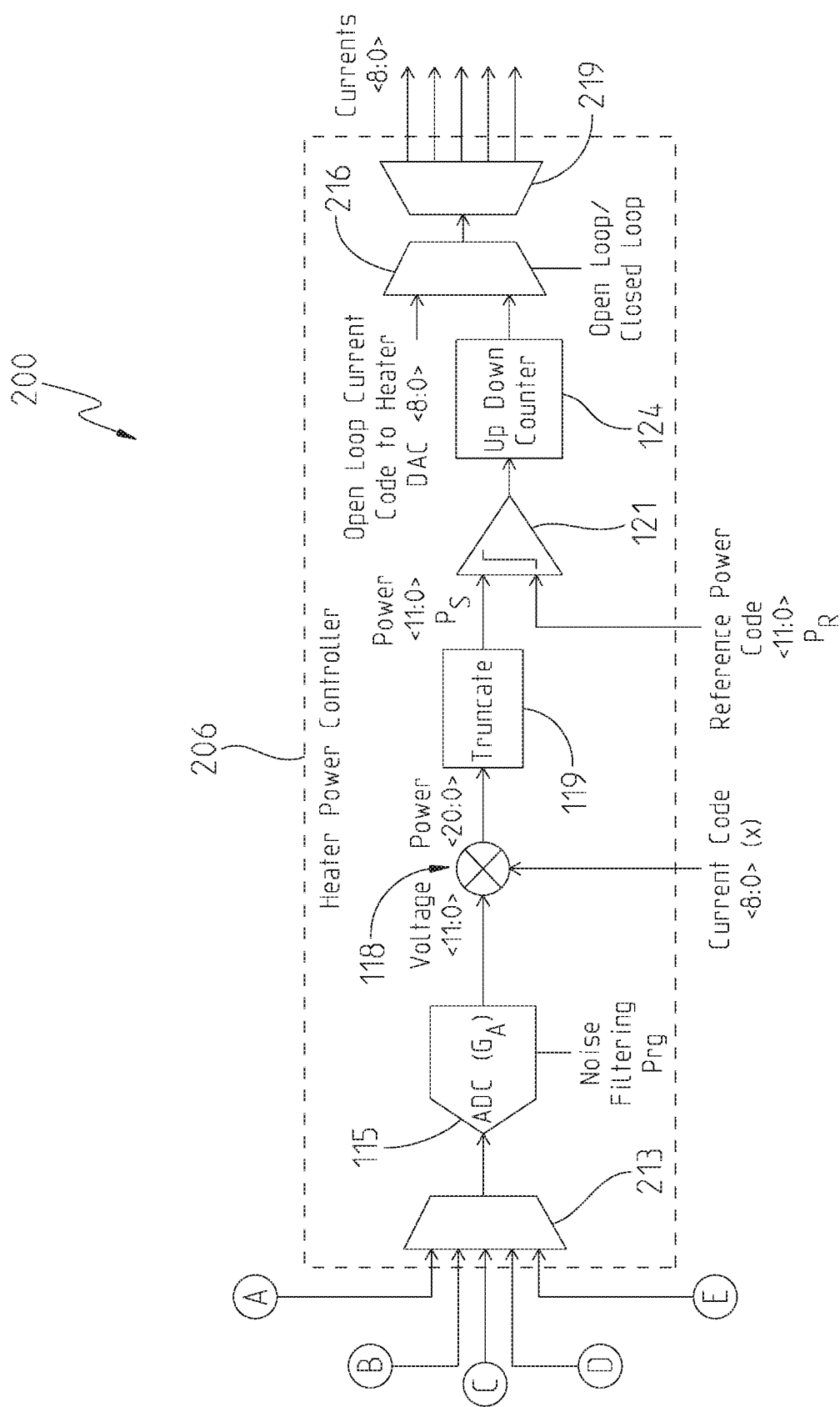

FIGS. 2A and 2B illustrates another example power-controlled heater circuit 200. The power-controlled heater circuit 200 is similar to the power-controlled heater circuit 100 shown in FIG. 1 but includes a number of heater circuits 103a through 103n (the "heaters 103"). The heaters 103 can be independently controlled by the heater power controller 206, which is similar to the heater power controller 106 shown in FIG. 1 but also includes a multiplexer 213, a mode selection multiplexer or switch 216, and a demultiplexer 219. The heater power controller 206 can provide independent current codes, $X_A$ through $X_N$, to corresponding heaters 103a through 103n. The reference power code provided as input to the heater power controller 206 can be the same for each of the heaters 103. However, in some examples, separate reference power codes can be provided to the heater power controller 206 for each of the heaters 103.

The power-controlled heater circuit 200 can utilize time division multiplexing to maintain and evaluate the power of each of the heaters 103 in sequence. To this end, a respective analog voltage across each heater resistance of the heaters 103 can be input to the multiplexer 213. The multiplexer 213 can switch between these analog voltages in sequence. For example, the multiplexer 213 can provide the analog voltage across the heater resistance of the heater 103a to the ADC 115 of the heater power controller 206 for a first predetermined period of time. The multiplexer 213 can then provide the analog voltage across the heater resistance of the heater 103b to the ADC 115 for a second predetermined period of time after the first predetermined period of time, switch to the heater 103c, and so on.

The overall operation of the heater power controller 206 is similar to that of the heater power controller 106 described above with reference to FIG. 1. In order to provide a particular current code to one of the heaters 103, the heater power controller 106 also includes the demultiplexer 219. The demultiplexer 219 can work in concert with the multiplexer 213 to control the sequential operation of the heater power controller 206 among heaters 103. The bidirectional counter 124 can include an individual register or counter for each of the heaters 103 and maintain a current code for each of the heaters 103.

When a specific heater 103 or heater channel is selected for monitoring, right after the full conversion of the ADC 115, the heater power controller 206 can enter the automatic power control states for that heater 103. These states can include multiplication, comparison, and counter update. Once the counter for the particular heater 103 is updated, the state machine can exit the heater channel and move to the next channel. An example sequence is shown in table 1.

TABLE 1

| ADC Conversion | | | | | | | | | | | | Automatic Power Control Loop | | |
|---|---|---|---|---|---|---|---|---|---|---|---|---|---|---|
| 11 | 10 | 9 | 8 | 7 | 6 | 5 | 4 | 3 | 2 | 1 | 0 | Multiplication | Comparison | Update |

In one example, the heater power controller 206 can also include the mode selection multiplexer or switch 216 that switches the heater power controller 206 from open loop operation to closed loop operation. In open loop operation, an open loop current code is provided, for example, as an initial input into the heater DAC of one of the heaters 103. During heater power calibration, the current code can be changed manually in open loop mode to attain a certain power, such as an optical power for a Laser Photonic Integrated Circuit (L-PIC). Although in open loop mode, the measured output power can still be calculated by the heater power controller 206. A truncated version of the measured output power can be stored in a register in the bidirectional counter 124, or other suitable register, as the reference current for closed loop operation. The current code for the corresponding measured output power can be saved in a register as well. This current code could be used as an initial starting point for closed loop operation. This initialization can substantially reduce the settling time of the loop.

The operation of the power-controlled heater circuits 100 and 200 can be based on one or more functions or equations. For Equations (1)-(4) below, $P_S$ can refer to measured or calculated heater power code (e.g., from the multiplier), $G_D$ can refer to heater DAC gain, R can refer to resistance of a resistance register for a heater circuit, $G_A$ can refer to ADC gain, and x can refer to the current code. $P_R$ can refer to reference power code, calculated as $P_S$ during open loop operation. $A_C$ can refer to a transfer function of the comparator and bidirectional counter. $P_O$ can refer to actual power output of the heater.

$$P_s = G_D R G_A x^2 = P_R \text{ at calibration} \quad (1)$$

$$(P_s - P_R)A_C = x \quad (2)$$

$$P_s = P_R \text{ with } A_c \to \infty \quad (3)$$

$$P_o = G_D^2 R x^2 \quad (4)$$

$$\text{For } \Delta R, \frac{\Delta P_o}{P_o} = 0 \quad (5)$$

$$\text{For } \Delta G_D, \frac{\Delta P_o}{P_o} = \frac{\Delta G_D}{G_D} \quad (6)$$

$$\text{For } \Delta G_A, \frac{\Delta P_o}{P_o} = \frac{\Delta G_A}{G_A} \quad (7)$$

Figure 3:
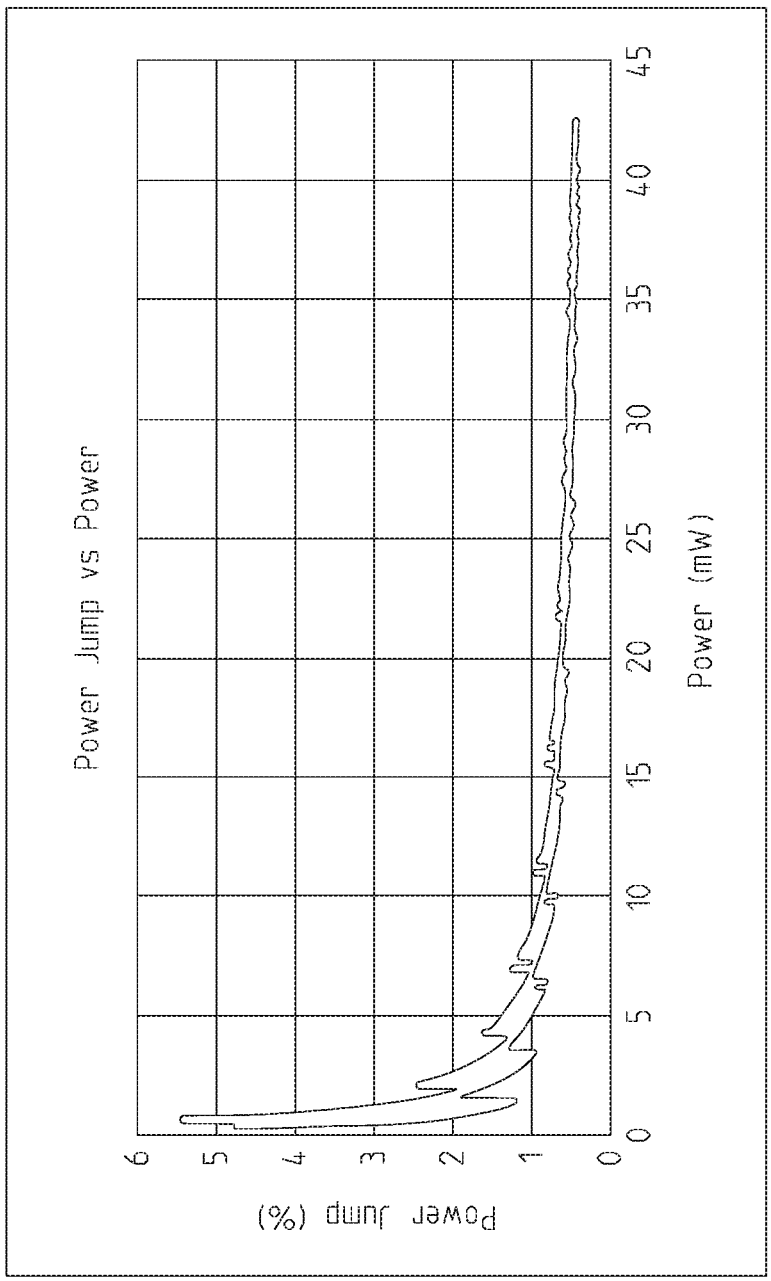
FIG. 3 is a graph that illustrates power jump percentage versus power for a power-controlled heater circuit according to various embodiments described herein.

FIG. 3 is a graph that illustrates power jump percentage versus power for a power-controlled heater circuit. In some cases, the loop can jitter or jump by approximately 1 least significant bit (LSB) code of heater DAC or current code. This could cause jitter in the final optical eye diagram of L-PIC. The number of code dithering in the power domain can be lower at a lower power level and higher at a higher power level. However, if dithering is converted as a percentage of the actual power level, the lower power has higher dithering than the higher power.

In some examples, the dithering can be more than 1 LSB due to non-idealities, such as differential nonlinearity (DNL). If the DNL is 0.5 LSB then total dithering can be 1+0.5=1.5 LSB. All the numbers as shown in FIG. 3 can be 50% greater. Care can be taken to keep the dithering as low as possible to optimize system performance.

In order to prevent dithering, the loop can stop updating if the calculated multiplication value is within the predetermined percentage from the target value. This feature can provide the advantage of no dithering of current code. That is, no dithering of the measured output power. However, with this feature, the measured output power can include a certain amount of error based on the selected percentage of the target value. To this end, the comparator circuit 121 can generate and provide the bidirectional counter 124 with a signal that prevents the code register in the bidirectional counter 124 from updating when the measured output power from the digital multiplier 118 is within the selected percentage from the target value.

Although the above embodiments disclose multiplying a measured voltage of the heater resistance by an input current value to obtain a monitored power value that is compared to a reference value, in embodiments, the measured voltage of the heater resistance is compared to a reference voltage value. The reference voltage value may be computed by dividing a reference power value by the input current value.

Figure 4:
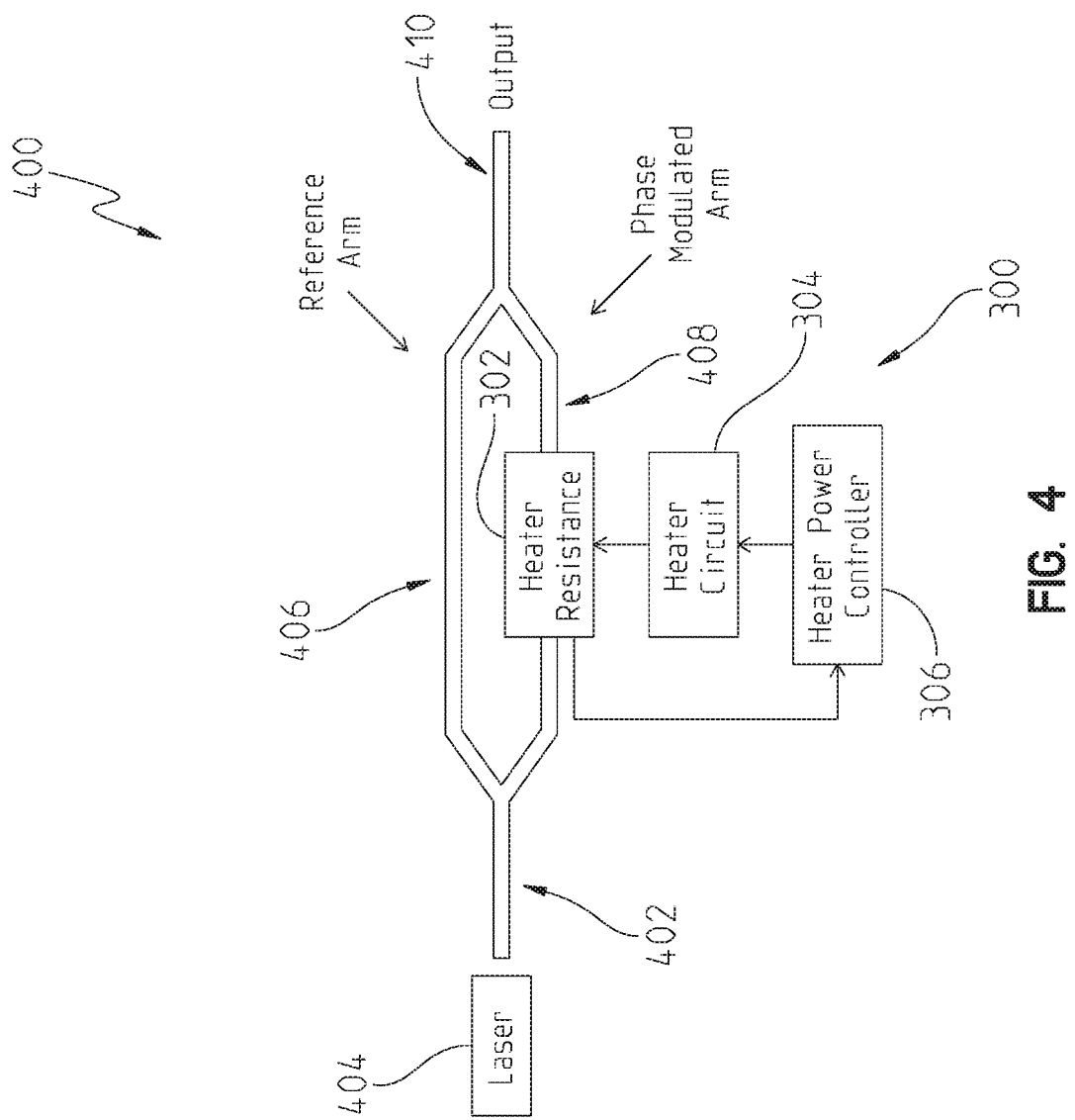
FIG. 4 illustrates an exemplary optical modulation device.

Referring to FIG. 4, a on-chip heater system 300 is incorporated into an arm of a Mach-Zehnder interferometer 400. Mach-Zehnder interferometer 400 includes a waveguide 402 which receives light from a laser source 404. Waveguide 402 directs the received light along its length to a reference arm 406 and a phase modulated arm 408. On-chip heater system 300 is provided in phase modulated arm 408 of the Mach-Zehnder interferometer 400. By varying the power passing through a heater resistance 302 of heater system 300, the phase of the light passing along phase modulated arm 408 is changed relative to the phase of light traveling along reference arm 406. The modulated light from reference arm 406 and phase modulated arm 408 are carried by an output waveguide 410.

Heater resistance 302 is powered by a heater circuit 304. Heater circuit 304 controls the current that is passing through heater resistance 302. The current supplied by heater circuit 304 is based on a current command provided to heater circuit 304 by a heater power controller 306. Heater power controller 306 bases the current command on at least a monitored electrical characteristic of heater resistance 302. An exemplary monitored electrical characteristic is a voltage drop across the heater resistance 302. In embodiments, heater DAC 109 is the heater circuit 304 and heater power controller 106 is the heater power controller 306. In embodiments, heater power controller is microprocessor based and instructions are stored in a memory accessible by the microprocessor.

Figure 5:
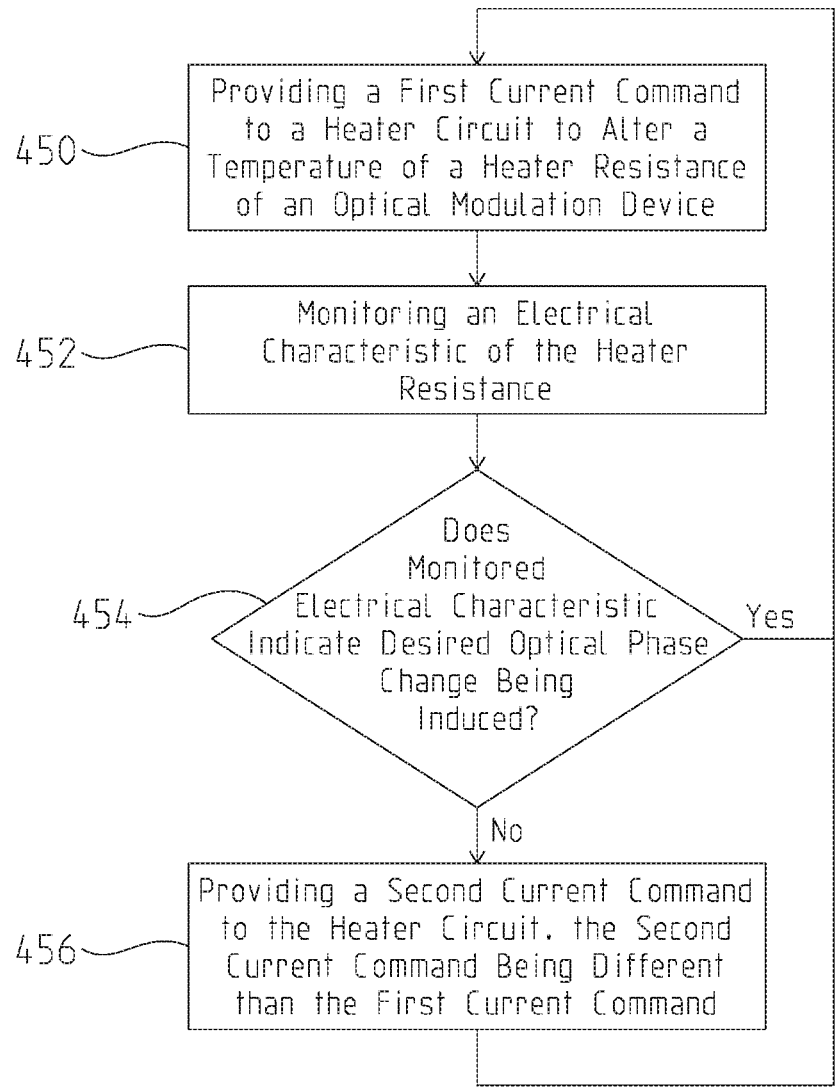
FIG. 5 illustrates an exemplary operation of a heater system for an optical modulation device.

Referring to FIG. 5, an operation of heater system 300 to induce a desired optical phase change in the phase modulated arm 408 of optical modulation device 400 is shown. A first current command is provided to heater circuit 304 to alter a temperature of heater resistance 302, as represented by block 450. An electrical characteristic of the heater resistance 302 is monitored, as represented by block 452. A determination is made by heater power controller 306 whether the monitored electrical characteristic indicates the desired phase change is being induced in the phase modulated arm 408 of optical modulation device 400, as represented by block 454. If so, no change is made to the current command. If a determination is made that the monitored electrical characteristic indicates that a first optical phase change different from the desired optical phase change is being induced in the optical modulation device a second current command is provided to the heater circuit 304, the second current command being different than the first current command, as represented by block 456. The second current command alters the optical phase change of the optical modulation device towards the desired optical phase change.

In embodiments, the determination that the monitored electrical characteristic indicates that the first optical phase change is being induced in the optical modulation device which is different from the desired optical phase change includes determining a first value based on the monitored electrical characteristic, comparing the first value to a target value, the target value being representative of the desired optical phase change, and when a difference between the first value and the target value has a first characteristic, determine that the first optical phase change is being induced. An exemplary first characteristic is that a magnitude of the difference exceeds a threshold. In an example thereof, the monitored electrical characteristic is a voltage drop across the heater resistance, the first value is a heater power value, and the target value is a reference power value. An exemplary current command is a digital current code. In embodiments, the operation illustrated in FIG. 5 is carried out automatically by heater system 300 or power controlled heater circuit 100.

Although the embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

We claim:

1. An on-chip heater of an optical phase modulation device to induce a desired optical phase change in the optical phase modulation device, the on-chip heater comprising:
    a heater circuit including a heater resistance which induces an optical phase change in the optical phase modulation device; and
    a heater power controller operatively coupled to the heater circuit to directly monitor an electrical characteristic of the heater circuit and to control an input current to the heater circuit, the input current of the heater circuit being set based on the monitored electrical characteristic and a target value corresponding to the desired optical phase change;
    wherein the heater power controller is configured to determine that the monitored electrical characteristic indicates that a first optical phase change being induced in the optical phase modulation device is different from the desired optical phase change by:
    determining a first value based on the monitored electrical characteristic;
    comparing the first value to the target value, the target value being representative of the desired optical phase change; and
    when a difference between the first value and the target value has a first characteristic, determine that the first optical phase change is being induced.

2. The on-chip heater of claim 1, wherein the monitored electrical characteristic is a monitored voltage of the heater circuit.

3. The on-chip heater of claim 2, wherein the monitored voltage of the heater circuit is a voltage drop across the heater resistance.

4. The on-chip heater of claim 1, wherein the monitored electrical characteristic and the target value corresponding to the desired optical phase change are evaluated to determine if the input current to the heater circuit should be altered to cause the induced optical phase change to equal the desired optical phase change.

5. The on-chip heater of claim 4, wherein the monitored characteristic is a monitored voltage drop across the heater resistance and the monitored voltage, the target value, and the input current of the heater circuit are evaluated to determine if the input current to the heater circuit should be altered to cause the induced optical phase change to equal the desired optical phase change.

6. The on-chip heater of claim 5, wherein the monitored voltage is multiplied by the input current to provide a monitored power of the heater resistance, the target value is a target power value, and the monitored power is compared to the target power value.

7. The on-chip heater of claim 6, wherein if the monitored power of the heater resistance exceeds the target power value by a first amount, the input current to the heater circuit is reduced and if the target power value exceeds the monitored power of the heater resistance by a second amount the input current to the heater circuit is increased.

8. The on-chip heater of claim 1, wherein the input current of the heater circuit is a digital current code and the heater circuit includes a heater digital-to-analog converter (DAC) configured to provide a current to flow through the heater resistance based on the digital current code.

9. The on-chip heater of claim 8, wherein the monitored electrical characteristic of the heater circuit is a monitored voltage drop across the heater resistance and the heater power controller includes:
    an analog-to-digital converter (ADC) configured to convert the monitored voltage drop across the heater resistance to a digital voltage code;
    a digital multiplier configured to multiply the digital voltage code with the digital current code to generate a heater power code; and
    a bidirectional counter configured to update the digital current code to regulate power dissipated by the heater resistance based on a comparison of a reference power code and the heater power code.

10. An optical phase modulation device, comprising:
    an input waveguide;
    a reference arm waveguide optically coupled with the input waveguide;
    a phase modulated arm waveguide optically coupled with the input waveguide;
    an output waveguide optically coupled to the reference arm waveguide and the phase modulated arm waveguide; and
    a heater including:
        a heater resistance positioned to modulate light traversing the phase modulated arm waveguide,
        a heater circuit operatively coupled to the heater resistance to provide a current to the heater resistance, and
        a heater power controller operatively coupled to the heater circuit to directly monitor an electrical characteristic of the heater circuit and determine whether a first optical phase change is being induced in the phase modulated arm waveguide by comparing a first value, based on the monitored electrical characteristic of the heater resistance, to a target value representative of a desired optical phase change;
        wherein the heater power controller responds to a difference between the first value and the target value having a first characteristic by controlling the current provided by the heater circuit to the heater resistance.

11. A method of controlling an optical modulation device to induce a desired optical phase change of the optical modulation device, the method comprising the steps of:
    providing a first current command to a heater circuit to alter a temperature of a heater resistance of an optical modulation device;
    directly monitoring an electrical characteristic of the heater resistance;
    determining that the monitored electrical characteristic indicates that a first optical phase change different from the desired optical phase change is being induced in the optical modulation device; and
    in response to the determination that the first optical phase change is being induced, providing a second current command to the heater circuit, the second current command being different than the first current command;
    wherein the step of determining that the monitored electrical characteristic indicates that the first optical phase change being induced in the optical modulation device is different from the desired optical phase change includes the steps of:
        determining a first value based on the monitored electrical characteristic;

comparing the first value to a target value, the target value being representative of the desired optical phase change; and when a difference between the first value and the target value has a first characteristic, determine that the first optical phase change is being induced.

12. The method of claim 11, wherein the second current command alters the optical phase change of the optical modulation device towards the desired optical phase change.

13. The method of claim 11, wherein the first characteristic is that a magnitude of the difference exceeds a threshold.

14. The method of claim 11, wherein the monitored electrical characteristic is a voltage drop across the heater resistance, the first value is a heater power value, and the target value is a reference power value.

15. The method of claim 11, wherein the first current command is a digital current code.

16. An on-chip power-controlled heater, comprising:
a heater resistance;
a heater digital-to-analog converter (DAC) configured to provide a current to flow through the heater resistance based on a digital current code provided to the heater DAC;
an analog-to-digital converter (ADC) configured to monitor a voltage across the heater resistance and convert the voltage to a digital voltage code;
a digital multiplier configured to multiply the digital voltage code with the digital current code to generate a heater power code; and
a bidirectional counter configured to update the digital current code to regulate power dissipated by the heater resistance based on comparison of a reference power code and the heater power code.

17. The on-chip power-controlled heater of claim 16, wherein the bidirectional counter increases a bit value of the digital current code and stores an updated digital current code in a register of the heater DAC based on the heater power code being less than the reference power code.

18. The on-chip power-controlled heater of claim 16, wherein the bidirectional counter decreases a bit value of the digital current code and stores an updated digital current code in a register of the heater DAC based on the heater power code being less than the reference power code.

19. The on-chip power-controlled heater of claim 16, wherein the bidirectional counter retains a bit value of the digital current code in a register of the heater DAC based on the heater power code being equal to the reference power code or within a threshold percentage of the reference power code.

20. The on-chip power-controlled heater of claim 16, wherein:
the heater resistance comprises a plurality of heater resistances; and
the heater DAC comprises a respective heater DAC for each of the plurality of heater resistances.

21. The on-chip power-controlled heater of claim 20, wherein the ADC comprises a multi-channel successive-approximation-register (SAR) ADC that utilizes time division multiplexing to regulate power for the plurality of heater resistances.

22. The on-chip power-controlled heater of claim 21, wherein the bidirectional counter is configured to update a digital current code for individual ones of the plurality of heater resistances.

23. A heater power controller, comprising:
an analog-to-digital converter (ADC) configured to monitor a voltage across a heater and convert the voltage to a digital voltage code;
a digital multiplier configured to multiply the digital voltage code with a digital current code to generate a heater power code; and
a bidirectional counter configured to regulate the digital current code based on comparison of the heater power code to a reference power code and provide the digital current code to a heater digital-to-analog converter (DAC) to regulate power dissipated by the heater.

24. The heater power controller of claim 23, wherein the ADC utilizes time division multiplexing to regulate power dissipated by a plurality of heaters.

25. The heater power controller of claim 24, wherein the bidirectional counter is further configured to update a plurality of registers corresponding to the plurality of heaters based on the time division multiplexing.

26. The heater power controller of claim 23, further comprising a comparator circuit that compares the heater power code to the reference power code.

27. The heater power controller of claim 23, wherein the heater power controller is an on-chip heater power controller for an optical phase modulation circuit.

28. The heater power controller of claim 23, wherein the reference power code comprises a predetermined number of bits, and the reference power code is compared to a subset of a total number of bits of the heater power code generated by the digital multiplier.

29. The heater power controller of claim 23, wherein the reference power code is determined by an open-loop mode of the heater power controller using a mode selection multiplexer.

30. A method for on-chip heater power control, the method comprising:
converting a voltage across a heater to a digital voltage code;
multiplying the digital voltage code with a digital current code to generate a heater power code;
comparing the heater power code to a reference power code to regulate the digital current code; and
inputting the digital current code to a heater digital-to-analog converter (DAC) to control a current to flow through the heater.

31. The method of claim 30, further comprising:
selecting open-loop operation for the on-chip heater power control using a mode selection multiplexer;
providing the heater DAC with an open-loop current code through the mode selection multiplexer;
determining an open-loop heater power code while the open-loop operation is selected, wherein the reference power code is a predetermined number of bits of the open-loop heater power code; and
selecting closed-loop operation for the on-chip heater power control using the mode selection multiplexer, wherein the digital current code is a closed-loop digital current code.

32. The method of claim 30, wherein the reference power code comprises a predetermined number of bits, and the reference power code is compared to a subset of a total number of bits of the heater power code.

33. The method of claim 30, further comprising increasing a bit value of the digital current code based on comparing the heater power code to the reference power code.

34. The method of claim 30, further comprising decreasing a bit value of the digital current code based on comparing the heater power code to the reference power code.

35. The method of claim 30, further comprising retaining a bit value of the digital current code in a register of the heater DAC based on the heater power code being within a predetermined threshold of the reference power code.

\* \* \* \* \*